(12) United States Patent
Tso et al.

(10) Patent No.: US 7,616,705 B1
(45) Date of Patent: *Nov. 10, 2009

(54) MONOLITHIC GPS RF FRONT END INTEGRATED CIRCUIT

(75) Inventors: Robert Tso, South San Gabriel, CA (US); Richard Joseph McConnell, Rancho Cucamonga, CA (US)

(73) Assignee: SiRF Technology Holdings, Inc., San Jose, CA (US)

( * ) Notice: Subject to any disclaimer, the term of this patent is extended or adjusted under 35 U.S.C. 154(b) by 256 days.

This patent is subject to a terminal disclaimer.

(21) Appl. No.: 09/916,087

(22) Filed: Jul. 26, 2001

Related U.S. Application Data (60) Provisional application No. 60/221,048, filed on Jul. 27, 2000.

(51) Int. Cl.
 *H03K 9/00* (2006.01)
 *H04L 27/00* (2006.01)

(52) U.S. Cl. .................... 375/316; 455/260; 455/150.1

(58) Field of Classification Search ............ 340/426.19; 342/357.12; 455/404.2, 259–260, 150.1; 375/136, 150, 147, 343, 316
See application file for complete search history.

(56) References Cited

U.S. PATENT DOCUMENTS

| | | | |
|---|---|---|---|
| 4,426,712 A | | 1/1984 | Gorski-Popiel |
| 4,445,118 A | | 4/1984 | Taylor et al. |
| 4,463,357 A | | 7/1984 | MacDoran |
| 4,578,678 A | | 3/1986 | Hurd |
| 4,667,203 A | | 5/1987 | Counselman, III |
| 4,701,934 A | * | 10/1987 | Jasper ......................... 375/147 |
| 4,754,465 A | | 6/1988 | Trimble |
| 4,785,463 A | | 11/1988 | Janc et al. |
| 4,809,005 A | | 2/1989 | Counselman, III |
| 4,821,294 A | | 4/1989 | Thomas, Jr. |
| 4,890,233 A | | 12/1989 | Ando et al. |
| 4,894,662 A | | 1/1990 | Counselman |

(Continued)

FOREIGN PATENT DOCUMENTS

GB 2 115 195 1/1983

(Continued)

OTHER PUBLICATIONS

Shaeffer, Derek K. "A 115mW CMOS GPS Receiver" Jun. 1998, http://smirc.stanford.edu/papers/Orals98s-derek.pdf.*

(Continued)

*Primary Examiner*—Jean B Corrielus
(74) *Attorney, Agent, or Firm*—Pillsbury Winthrop Shaw Pittman LLP (57) ABSTRACT

A highly integrated GPS RF Front End, an interface thereto, and a GPS receiver that incorporates the GPS RF front end, which uses a single conversion stage employing an image rejection mixer stage to eliminate the need for an image reject RF bandpass filter. Also a relatively high sample rate A/D is employed which allows a timeless monolithic IF Filter to be used. The disclosure also discusses a GPS Front End topology that is easily integrated from industry standard building blocks. With the broad variation in potential receiver designs, the present invention includes some specific receiver topologies that lend themselves to a high level of integration. The specific designs presented here are comprised of industry standard building blocks and functions that have been described elsewhere in the related art.

12 Claims, 4 Drawing Sheets

U.S. PATENT DOCUMENTS

| | | | |
|---|---|---|---|
| 4,894,842 A * | 1/1990 | Broekhoven et al. | 375/150 |
| 4,998,111 A | 3/1991 | Ma et al. | |
| 5,014,066 A | 5/1991 | Counselman, III | |
| 5,036,329 A | 7/1991 | Ando | |
| 5,043,736 A | 8/1991 | Darnell et al. | |
| 5,105,195 A * | 4/1992 | Conrad | 342/174 |
| 5,108,334 A | 4/1992 | Eschenbach et al. | |
| 5,177,490 A | 1/1993 | Ando et al. | |
| 5,185,610 A * | 2/1993 | Ward et al. | 342/357.11 |
| 5,202,829 A | 4/1993 | Geier | |
| 5,223,844 A | 6/1993 | Mansell et al. | |
| 5,225,842 A | 7/1993 | Brown et al. | |
| 5,257,195 A | 10/1993 | Hirata | |
| 5,293,170 A | 3/1994 | Lorenz et al. | |
| 5,311,195 A | 5/1994 | Mathis et al. | |
| 5,323,164 A | 6/1994 | Endo | |
| 5,343,209 A | 8/1994 | Sennott et al. | |
| 5,345,244 A | 9/1994 | Gildea et al. | |
| 5,347,284 A | 9/1994 | Volpi et al. | |
| 5,347,536 A | 9/1994 | Meehan | |
| 5,402,347 A | 3/1995 | McBurney et al. | |
| 5,416,712 A | 5/1995 | Geier et al. | |
| 5,420,593 A | 5/1995 | Niles | |
| 5,440,313 A | 8/1995 | Osterdock et al. | |
| 5,450,344 A | 9/1995 | Woo et al. | |
| 5,502,446 A * | 3/1996 | Denninger | 342/357.08 |
| 5,504,684 A | 4/1996 | Lau et al. | |
| 5,526,357 A * | 6/1996 | Jandrell | 370/346 |
| 5,535,278 A | 7/1996 | Cahn et al. | |
| 5,587,715 A | 12/1996 | Lewis | |
| 5,592,173 A | 1/1997 | Lau et al. | |
| 5,604,746 A * | 2/1997 | Oto | 370/481 |
| 5,625,668 A | 4/1997 | Loomis et al. | |
| 5,663,734 A | 9/1997 | Krasner | |
| 5,663,735 A | 9/1997 | Eshenbach | |
| 5,686,864 A * | 11/1997 | Martin et al. | 331/1 A |
| 5,739,786 A | 4/1998 | Greenspan et al. | |
| 5,781,156 A | 7/1998 | Krasner | |
| 5,786,789 A | 7/1998 | Janky | |
| 5,812,087 A | 9/1998 | Krasner | |
| 5,825,327 A | 10/1998 | Krasner | |
| 5,828,694 A | 10/1998 | Schipper | |
| 5,831,574 A | 11/1998 | Krasner | |
| 5,841,396 A | 11/1998 | Krasner | |
| 5,845,203 A | 12/1998 | LaDue | |
| 5,854,605 A | 12/1998 | Gildea | |
| 5,874,914 A | 2/1999 | Krasner | |
| 5,877,724 A | 3/1999 | Davis | |
| 5,877,725 A | 3/1999 | Kalafus | |
| 5,883,594 A | 3/1999 | Lau | |
| 5,884,214 A | 3/1999 | Krasner | |
| 5,889,474 A | 3/1999 | LaDue | |
| 5,903,654 A | 5/1999 | Milton et al. | |
| 5,907,809 A | 5/1999 | Molnar et al. | |
| 5,917,444 A | 6/1999 | Loomis et al. | |
| 5,920,283 A | 7/1999 | Shaheen et al. | |
| 5,923,293 A * | 7/1999 | Smith et al. | 342/455 |
| 5,923,703 A | 7/1999 | Pon et al. | |
| 5,926,131 A | 7/1999 | Sakumoto et al. | |
| 5,936,572 A | 8/1999 | Loomis et al. | |
| 5,943,363 A | 8/1999 | Hanson et al. | |
| 5,945,944 A | 8/1999 | Krasner | |
| 5,963,582 A | 10/1999 | Stansell, Jr. | |
| 5,977,909 A | 11/1999 | Harrison et al. | |
| 5,982,324 A | 11/1999 | Watters et al. | |
| 5,987,016 A | 11/1999 | He | |
| 5,994,923 A * | 11/1999 | Navabi | 326/89 |
| 5,999,124 A | 12/1999 | Sheynblat | |
| 6,002,362 A | 12/1999 | Gudat | |
| 6,002,363 A | 12/1999 | Krasner | |
| 6,009,317 A * | 12/1999 | Wynn | 455/296 |
| 6,009,551 A | 12/1999 | Sheynblat | |
| 6,016,119 A | 1/2000 | Krasner | |
| 6,040,798 A | 3/2000 | Kinal et al. | |
| 6,041,222 A | 3/2000 | Horton et al. | |
| 6,047,017 A | 4/2000 | Cahn et al. | |
| 6,052,081 A | 4/2000 | Krasner | |
| 6,055,265 A * | 4/2000 | Kim | 375/150 |
| 6,061,018 A | 5/2000 | Sheynblat | |
| 6,064,336 A | 5/2000 | Krasner | |
| 6,067,328 A | 5/2000 | Lewellen et al. | |
| 6,104,338 A | 8/2000 | Krasner | |
| 6,104,340 A | 8/2000 | Krasner | |
| 6,104,712 A | 8/2000 | Robert et al. | |
| 6,107,960 A | 8/2000 | Krasner | |
| 6,111,540 A | 8/2000 | Krasner | |
| 6,111,541 A | 8/2000 | Karmel | |
| 6,122,506 A | 9/2000 | Lau et al. | |
| 6,125,135 A * | 9/2000 | Woo et al. | 375/130 |
| 6,131,067 A | 10/2000 | Girerd | |
| 6,133,871 A | 10/2000 | Krasner | |
| 6,133,873 A | 10/2000 | Krasner | |
| 6,133,874 A | 10/2000 | Krasner | |
| 6,150,980 A | 11/2000 | Krasner | |
| 6,185,427 B1 | 2/2001 | Krasner | |
| 6,208,290 B1 | 3/2001 | Krasner | |
| 6,208,291 B1 | 3/2001 | Krasner | |
| 6,211,819 B1 | 4/2001 | King et al. | |
| 6,215,441 B1 | 4/2001 | Moeglein | |
| 6,215,442 B1 | 4/2001 | Sheynblat | |
| 6,222,484 B1 | 4/2001 | Seiple et al. | |
| 6,236,354 B1 | 5/2001 | Krasner | |
| 6,236,365 B1 | 5/2001 | LeBlanc et al. | |
| 6,239,742 B1 | 5/2001 | Krasner | |
| 6,259,399 B1 | 7/2001 | Krasner | |
| 6,262,623 B1 * | 7/2001 | Molnar | 327/552 |
| 6,271,720 B1 * | 8/2001 | Sevastopoulos | 327/556 |
| 6,272,430 B1 | 8/2001 | Krasner | |
| 6,289,041 B1 | 9/2001 | Krasner | |
| 6,295,024 B1 | 9/2001 | King et al. | |
| 6,307,504 B1 | 10/2001 | Sheynblat | |
| 6,313,786 B1 | 11/2001 | Sheynblat | |
| 6,314,308 B1 | 11/2001 | Sheynblat | |
| 6,324,211 B1 | 11/2001 | Ovard et al. | |
| 6,327,473 B1 | 12/2001 | Soliman et al. | |
| 6,330,290 B1 * | 12/2001 | Glas | 375/324 |
| 6,356,602 B1 | 3/2002 | Rodal et al. | |
| 6,359,940 B1 * | 3/2002 | Ciccarelli et al. | 375/316 |
| 6,377,209 B1 | 4/2002 | Krasner | |
| 6,393,046 B1 | 5/2002 | Kohli et al. | |
| 6,408,196 B2 | 6/2002 | Sheynblat | |
| 6,411,254 B1 | 6/2002 | Moeglein | |
| 6,411,892 B1 | 6/2002 | van Diggelen | |
| 6,417,801 B1 | 7/2002 | van Diggelen | |
| 6,421,002 B2 | 7/2002 | Krasner | |
| 6,429,814 B1 | 8/2002 | Van Diggelen et al. | |
| 6,433,731 B1 | 8/2002 | Sheynblat | |
| 6,453,237 B1 | 9/2002 | Fuchs et al. | |
| 6,466,161 B2 | 10/2002 | Turetzky et al. | |
| 6,466,612 B2 | 10/2002 | Kohli et al. | |
| 6,484,097 B2 | 11/2002 | Fuchs et al. | |
| 6,487,499 B1 | 11/2002 | Fuchs et al. | |
| 6,510,387 B2 | 1/2003 | Fuchs et al. | |
| 6,529,829 B2 | 3/2003 | Turetzky et al. | |
| 6,542,821 B2 | 4/2003 | Krasner | |
| 6,583,757 B2 | 6/2003 | Krasner | |
| 6,597,311 B2 | 7/2003 | Sheynblat | |
| 6,633,255 B2 | 10/2003 | Krasner | |
| 6,668,165 B1 * | 12/2003 | Cloutier | 455/336 |
| 6,680,695 B2 | 1/2004 | Turetzky et al. | |
| 6,707,423 B2 | 3/2004 | Turetzky et al. | |
| 6,856,794 B1 | 2/2005 | Tso et al. | |
| 6,873,288 B2 | 3/2005 | Heppe | |
| 2002/0064209 A1 | 5/2002 | Turetzky et al. | |

| | | | |
|---|---|---|---|
| 2002/0169578 | A1 | 11/2002 | Yang |
| 2003/0153289 | A1* | 8/2003 | Hughes et al. ............. 455/138 |
| 2006/0071851 | A1 | 4/2006 | Graas et al. |
| 2006/0280278 | A1* | 12/2006 | Schabel et al. ................ 377/47 |

FOREIGN PATENT DOCUMENTS

| | | |
|---|---|---|
| JP | 58-105632 | 6/1983 |
| JP | 7-036035 | 5/1986 |
| JP | 4-326079 | 11/1992 |
| WO | WO90/11652 | 10/1990 |

OTHER PUBLICATIONS

Sandpiper/Avocet Evaluation Kit User Guide, 5V/3.3V 12 channel GPS receivers, Axiom Navigation Inc. p. 1-50.*

Marketing Material: Qualcomm Cdma Technologies - Integrated Solutions - MGP6200TM Multimode GPS Processor (8 pages), Jun. 27, 2002.

Marketing Material: uNav Microelectronics—uN9x18 Low Power, High Performance GPS Receiver Chipset/uN9x18 GPS Receiver Solution (9 pages), Jul. 21, 2006.

Marketing Material: uNav Microelectronics, uN9x18 Low Power, High Performance GPS Receiver Chipset (2 pages), Jul. 21, 2006.

Marketing Material: Global Locate—Hammerhead II™, Single Chip AGPS Solution (2 pages), Jan. 2007.

Marketing Material/Press Release: Broadcom Introduces Advanced Single-Chip GPS Solution for Mobile .

Marketing Material/White Paper: SnapTrack: A Qualcomm Compan—SnapTrack's Wireless Assisted GPS™ (A-GPS) Solution Provides the Industry's Best Location Systems—Location Technologies for GSM, GPRS and WCDMA Networks (Qualcomm CDMA Technologies: Enabling the Future of Communications) (4 pages), Jan. 2003.

* cited by examiner

MONOLITHIC GPS RF FRONT END INTEGRATED CIRCUIT

CROSS-REFERENCE TO RELATED APPLICATIONS

This application claims priority under 35 U.S.C. § 119(e) of U.S. Provisional Patent Application No. 60/221,048, filed Jul. 27, 2000, entitled "MONOLITHIC GPS RF FRONT END IC WITH FULLY INTEGRATED VCO AND IF FILTER" by Robert Tso et al., which application is incorporated by reference herein.

BACKGROUND OF THE INVENTION

1. Field of the Invention

The present invention relates in general to Global Positioning System (GPS) receivers, and in particular to a GPS Radio Frequency (RF) front end Integrated Circuit (IC) with a high level of monolithic integration.

2. Description of the Related Art

GPS receivers, once used primarily for military and surveying applications, are finding new uses in the commercial arena. Location services, emergency location using 911 (E911) phone calls for cellular telephones, personal GPS receivers, etc. are all part of current and emerging products and services enabled by using GPS receivers.

A typical GPS receiver uses an RF-IF/Converter section that selects, amplifies, filters, and downconverts the received GPS signals, and a baseband processing section to despread and detect the downconverted signals and determine a position of the GPS receiver. The RF section of today's GPS receivers are designed by each company that makes the receiver, and therefore, there are no established standards for such designs.

The analog RF designs typically comprise a Low Noise Amplifier (LNA) section with a two pole bandpass or preselect filter on the input, output, or both, followed by a single, double, or triple conversion receiver topology. The output of the last Intermediate Frequency (IF) section can be an amplitude limited Phase Modulated (PM) signal, which is typically called a 1 bit signal, or it can be a 2 bit system, typically consisting of a magnitude signal and sign signal. The analog RF section can also be partitioned at the output of a $\geq 2$ bit A/D converter. The last IF stage may contain a limiter for a 1-bit system, or Automatic Gain Control (AGC) may be used to allow limiting to be performed by the $\geq 2$ bit A/D converter.

For a single conversion receiver, the IF filtering usually follows an image reject mixer, and is typically a $\geq 2$ pole design. The IF filter can be a balanced design to achieve common mode noise a rejection, or be a single ended filter. The typical image rejection performance of the image reject type mixer is approximately 20 dB or better, which is adequate for GPS.

A double conversion receiver typically comprises an LNA, an image rejection filter, a mixer, a first IF image rejection filter, a second mixer, and the final IF filter, and amplifier.

The gain of these systems is usually selected to be as small as feasible, while still allowing the final IF amplifier to achieve the desired output level, allowing for component variation. The gain of this system is typically governed by the noise bandwidth of the entire receive chain, that is the gain of the system is as needed to take in the noise power at the input, filter it, and then drive the receiver output to the proper levels.

The oscillator and/or frequency synthesizer sections of these receivers generate the desired timing, sampling, and mixer LO frequencies needed to downconvert the input RF signal to the proper IF frequencies. The necessary frequencies generated vary from design to design, and are generally unique to each receiver. Historically there has been little consistency among designs of GPS receivers. One common trait is that the input reference frequency must be very stable in terms of short term noise, or else the GPS signal processing will experience deleterious cycle slips in the signal tracking loops, resulting in loss of lock or other forms of impaired receiver performance.

A highly integrated RFIC that is compatible with the frequency plan disclosed in U.S. Pat. No. 5,897,605, which is incorporated by reference herein, provides utility in the implementation of GPS receivers.

Because there is little consistency between GPS receiver designs, it is difficult to design an RF portion of the GPS receiver that is compatible with more than one baseband processing section of a GPS receiver. Further, difference in frequency plans for GPS receivers make the RF portion and the baseband processing sections of different GPS receivers incompatible.

It can be seen, then, that there is a need in the art for a GPS receiver that can accept the RF GPS signal and convert it to a form that can be applied to a digital processing section, typically implemented as a GPS Processor ASIC. It can also be seen that there is a need in the art for a GPS RF front end that can be implemented primarily in a monolithic RFIC requiring a minimum of external components. It can also be seen that there is a need in the art for a GPS RF front end that uses receiver topologies that can be implemented using standard building blocks.

SUMMARY OF THE INVENTION

To minimize the limitations in the prior art, and to minimize other limitations that will become apparent upon reading and understanding the present specification, the present invention discloses a receiver topology that is easily integrated from industry standard building blocks. With the broad variation in potential receiver designs, the present invention includes some specific receiver topologies that lend themselves to a high level of integration. The specific designs presented here ate comprised of industry standard building blocks and functions that have been described elsewhere in the related art.

An apparatus in accordance with the present invention comprises the RF/IF-Converter portion of a GPS receiver. The RF/IF-Converter portion is embodied in an RFIC that includes an image rejection combining filter, wherein the noise bandwidth of the GPS receiver is set by the IF active filter, an Automatic Gain Control (AGC) amplifier, an Analog-to-Digital Converter (ADC), and a frequency synthesizer section.

It is an object of the present invention to accept the RF GPS signal and convert it to a form that can be applied to a digital processing section, typically implemented as a GPS Processor ASIC. It is another object of the present invention to provide a GPS RF front end that can be implemented primarily in a monolithic RFIC requiring a minimum of external components. It is another object of the present invention to provide a GPS RF front end that uses receiver topologies that can be implemented using standard building blocks.

BRIEF DESCRIPTION OF THE DRAWINGS

Referring now to the drawings in which like reference numbers represent corresponding parts throughout.

DETAILED DESCRIPTION OF THE DRAWINGS

In the following description of the preferred embodiment, reference is made to the accompanying drawings that form a part hereof, and in which is shown by way of illustration a specific embodiment in which the invention may be practiced. It is to be understood that other embodiments may be utilized and structural changes may be made without departing from the scope of the present invention.

GPS Overview

Figure 1:
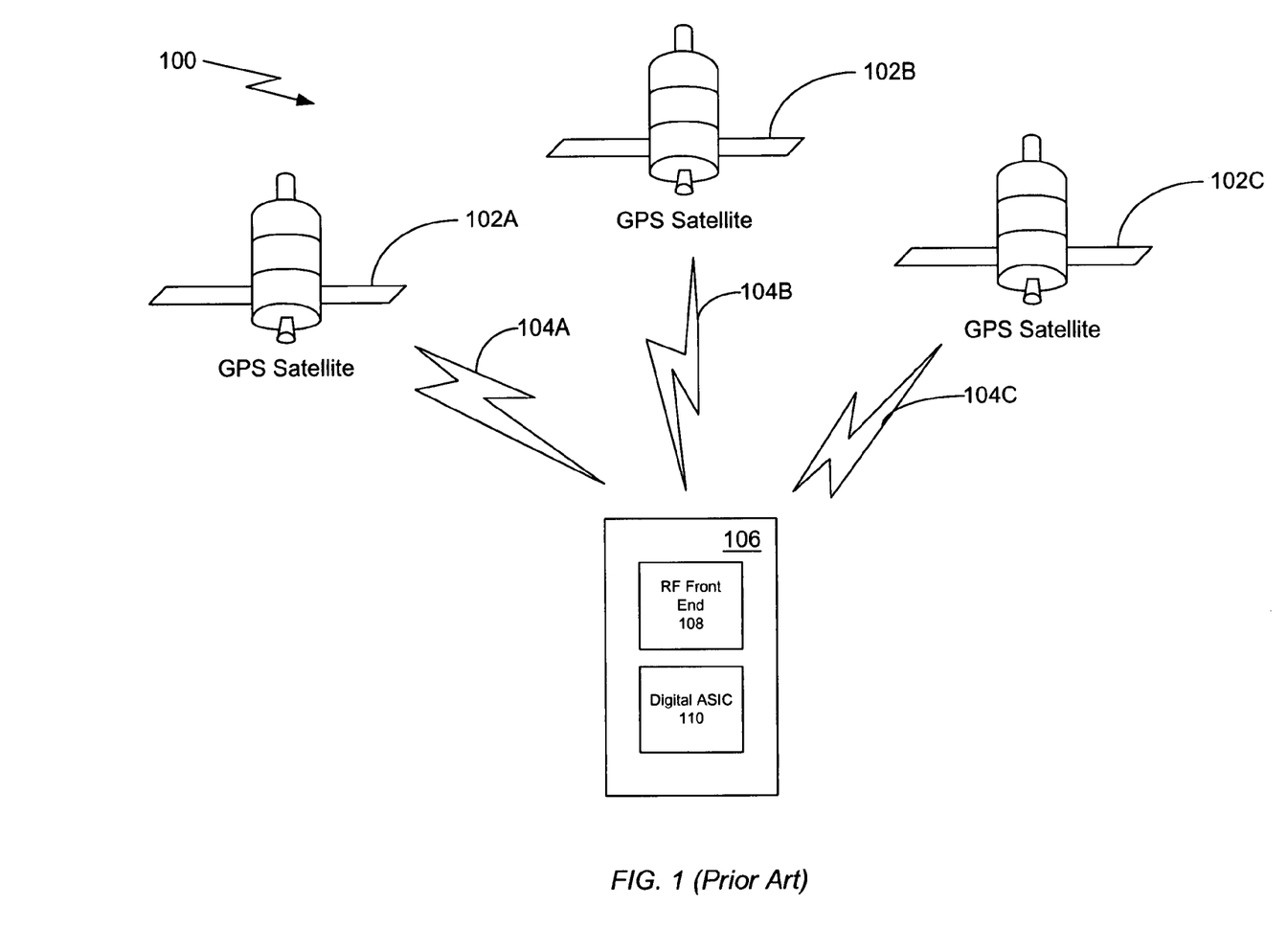
FIG. 1 illustrates a typical GPS position determination system.

FIG. 1 illustrates the essential elements of a GPS position determination system.

System 100 comprises several GPS satellites 102A-102C. Each GPS satellite 102A-102C emits signals 104A-104C respectively, which are spread-spectrum Radio Frequency (RF) signals in the L-band of the RF spectrum. These signals contain information regarding satellite 102A-102C identification (also known as SV number), time of transmission of the signal, etc. Mote information regarding the data content and structure of the signals can be found in "The Navstar Global Positioning System" by T. Logsdon, which reference is incorporated by reference herein. Three GPS satellites 102A-102C and three signals 104A-104C are shown for illustrative purposes only; system 100 comprises typically twenty-four operational satellites at different orbits, such that several satellites are typically visible to any given point on the earth at any specific time.

At least one of the signals 104A-104C is received at a GPS receiver 106, which typically comprises an RF Front End 108 and a digital Application Specific Integrated Circuit (ASIC) 110. The GPS RF Front End 108, downconverts the L-band signals 104A-104C to a lower frequency and the digital ASIC 110 performs correlation, detection and demodulation of the GPS signals 104A-104C to determine a distance between the GPS receiver 106 and each of the satellites 102A-102C, depending on which signals 104A-104C are received. For example, if only signals 104A and 104B are received by GPS receiver 106, then the distance between GPS receiver and GPS satellite 102C is not computed by GPS receiver 106. These distances are determined by comparing a clock located in the GPS receiver with the demodulated time data determined from the signals 104A-104C that have been received by the GPS receiver 106, and from the equation distance=rate×time, distance is determined, because the signals 104A-104C travel at a rate equal to that of the speed of light. These distances are known as "pseudoranges" because certain errors have not been removed from the distance calculations.

More complex GPS receivers 106 take into account certain errors in the distance determinations derived from signals 104A-104C. For example, the clock in the GPS receiver 106, typically called the "realtime clock", but can also be part of the RF front end 108, may have certain errors associated with it, the GPS satellites 102A-102C may not be in their exact orbital slot, there may be ionospheric conditions that affect the distance calculation, and other factors. Given the positions of each satellite and having determined distances to satellites have been determined by the 15; GPS receiver 106, the GPS receiver 106 can then output a longitude and latitude position of the GPS receiver 106. Typically, two to four distances must be calculated by the GPS receiver 106 to determine the position of GPS receiver 106.

The GPS Receiver

Figure 2:
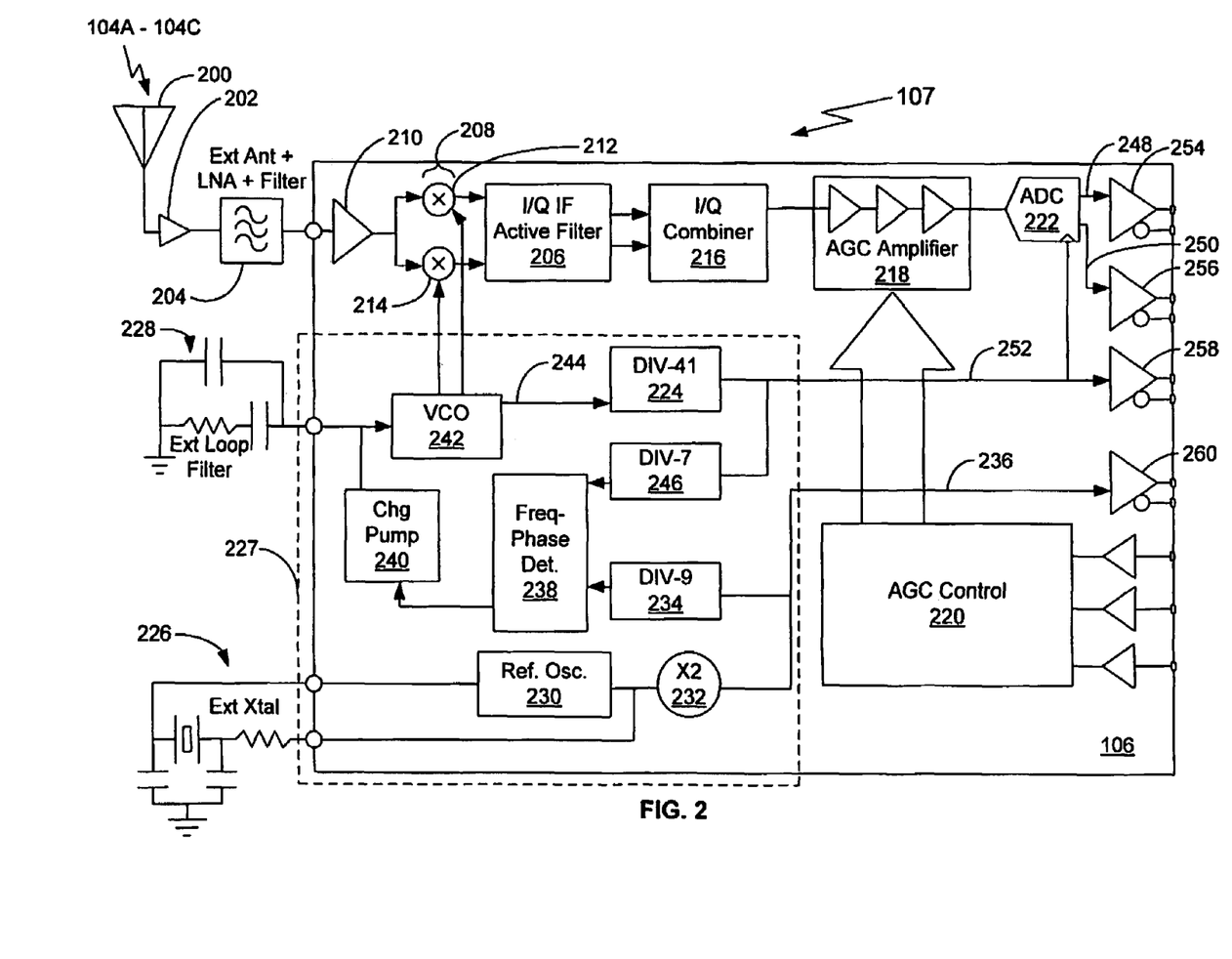
FIG. 2 illustrates a GPS RF front end in accordance with the present invention.

FIG. 2 illustrates a GPS RF front end in accordance with the present invention.

FIG. 2 illustrates RF front end 107, which includes monolithic and discrete elements. The electronics of the GPS receiver 106 are typically implemented as a fully custom Radio Frequency Integrated Circuit (RFIC), coupled to a GPS processor or GPS engine implemented using digital ASIC technology. One such GPS engine is described in U.S. Pat. No. 5,897,605, which is incorporated by reference herein. The GPS signals 104A-104C are typically received by a GPS antenna 200, and are then applied to an LNA or section 202. The LNA 202 may be fully included in the RFIC or may be distributed between the RFIC and an external amplifier, to achieve a better noise figure. The LNA section 202 may have an input filter to limit unwanted signals which may cause receiver interference. The LNA 202 may use an output filter 204 to limit the unwanted out of band signals. U.S. Pat. No. 4,701,934, issued to Jasper, which is incorporated by reference herein, presents a system where the LNA output filter 204 is used as the receiver noise bandwidth setting filter, but in the implementation described in the Jasper patent, this filter 204 is also used to attenuate out of band intermodulation products and high level out of band spurious signals that could cause receiver 106 performance degradation.

In the present invention the noise bandwidth of the receiver 106 is set in an IF filter 206 following an image reject mixer 208. In the preferred embodiment, the 6 dB bandwidth of the IF filter 206 is nominally 6 MHz. The output from an internal LNA 210 is applied to the input of the image reject mixer 208. The image reject mixer 208 comprises 2 double-balanced mixers 212 and 214 with In-phase LO (I-LO) and Quadrature-phase LO (Q-LO) inputs, and I-IF and Q-IF outputs, I and Q Active Filter Circuits 206 and a combiner circuit (phase shift network) 216. The I-IF and Q-IF outputs are combined using phase shift network 216 to obtain a single IF output. The L1 GPS signal, which is centered at 1575.42 MHz, is down-converted to the IF frequency at approximately 9.5 MHz by the image reject mixer 208. An IF AGC amplifier 218 boosts the IF signal to the proper level for quantizing by a 2 bit A/D converter 222. The IF AGC amplifier 218 gain is controlled from the digital processing section in the digital ASIC 110 (FIG. 1), by way of an AGC control block 220. The sample clock for the A/D converter 222 is provided by an ACQCLK signal 252, which is generated by a Divide by 41 section 224 which is synthesized by a Phase Locked Loop (PLL) locked to a crystal oscillator 226, which provides a reference signal. Typically, the ACQCLK signal 252 has a frequency approximately equal to 37.3333fo, where fo=1.023 MHz. In the preferred embodiment, the digitized GPS information bearing signal is provided as 2-bit Positive ECL (PECL) levels by PECL buffers 254, 256 and sent to the digital ASIC 110.

A synthesizer section 227 of the RF front end 107 is typically entirely contained in the RFIC except for loop filter components 228, and the support components of crystal oscillator active circuitry that may be referred to as a crystal oscillator or a reference oscillator 230. The reference oscillator 230 can be implemented using a crystal resonator 226, or using a signal from au external Temperature Compensated crystal Oscillator (TCXO). The crystal resonator 226 frequency is typically nominally 24.5535 MHz, and can vary by 40 parts per million (ppm) around this frequency. The reference oscillator 230 frequency is doubled by a frequency doubler 232 and then divided by 9 by a divider 234. Of course, the reference oscillator 230 can generate a frequency of twice that of 24.5535 MHz, which eliminates the need for the frequency doubler 232. The doubled frequency (or direct frequency if it is already generated) is also sent to a PECL output buffer 260 to provide a signal 236, typically named GPSCLK, which is a GPS clock signal used by the digital ASIC 110. Typically, the GPSCLK signal 236 has a frequency of approximately 48fo, where fo=1.023 MHz. The divided-by-9 signal is applied to a phase/frequency detector 238 for the reference input of the phase-lock-loop.

A voltage controlled oscillator (VCO) 242 that operates at a typical nominal frequency of 1565.97 MHz is implemented entirely within the RFIC, and provides 3 output signals. A monolithic VCO, such as described in U.S. Pat. No. 5,917,383, which is incorporated by reference herein, may be used. The I and Q outputs of this oscillator 242 are sent to the mixers 212 and 214, and the P output 244 to the divider 224. This divider 224 takes the output signal 244 of the VCO 242 and divides it by 41. The output of this divider 224 is used as the 2-bit A/D sample clock, and is also provided as an RFIC output, ACQCLK signal 252. The divider 224 output is also further divided by 7 at divider 246, and the output of divider 246 is sent to the phase/frequency detector 238 as the feedback signal for the phase-locked loop (PLL) synthesizer.

The output of the phase/frequency detector 238 is applied to a charge pump section 240. The charge pump section 240 is internal to the RFIC, with the loop filter 228 implemented externally to the RFIC, with passive components. The output of the loop filter 228 is used to control the frequency and phase of signals provided by VCO 242.

Sampled SIGN and MAG digital signals 248 and 250, respectively, are provided to PECL buffers 254 and 256 to send the signal to the GPS digital ASIC 110 for digital processing. The near one-quarter ratio of the IF frequency and the ACQCLK signal 252 allow for generation of "near baseband" I and Q signals representing the GPS signal using the sampling and decimation method described in the aforementioned U.S. Pat. No. 5,897,605 patent. Interface buffers 254-260 are used to provide PECL signals to the GPS digital ASIC 110.

The system of the present invention is differentiated from the system described in the Jasper patent in the generation and control of the LO, the IF filtering, the image reject mixing, and the A/D conversion process, and that the RFIC of the present invention is designed to implemented with a very high level of integration. This is accomplished by setting the noise bandwidth of the receiver 106 using the IF filter 206 following the dual mixers 208.

Figure 3:
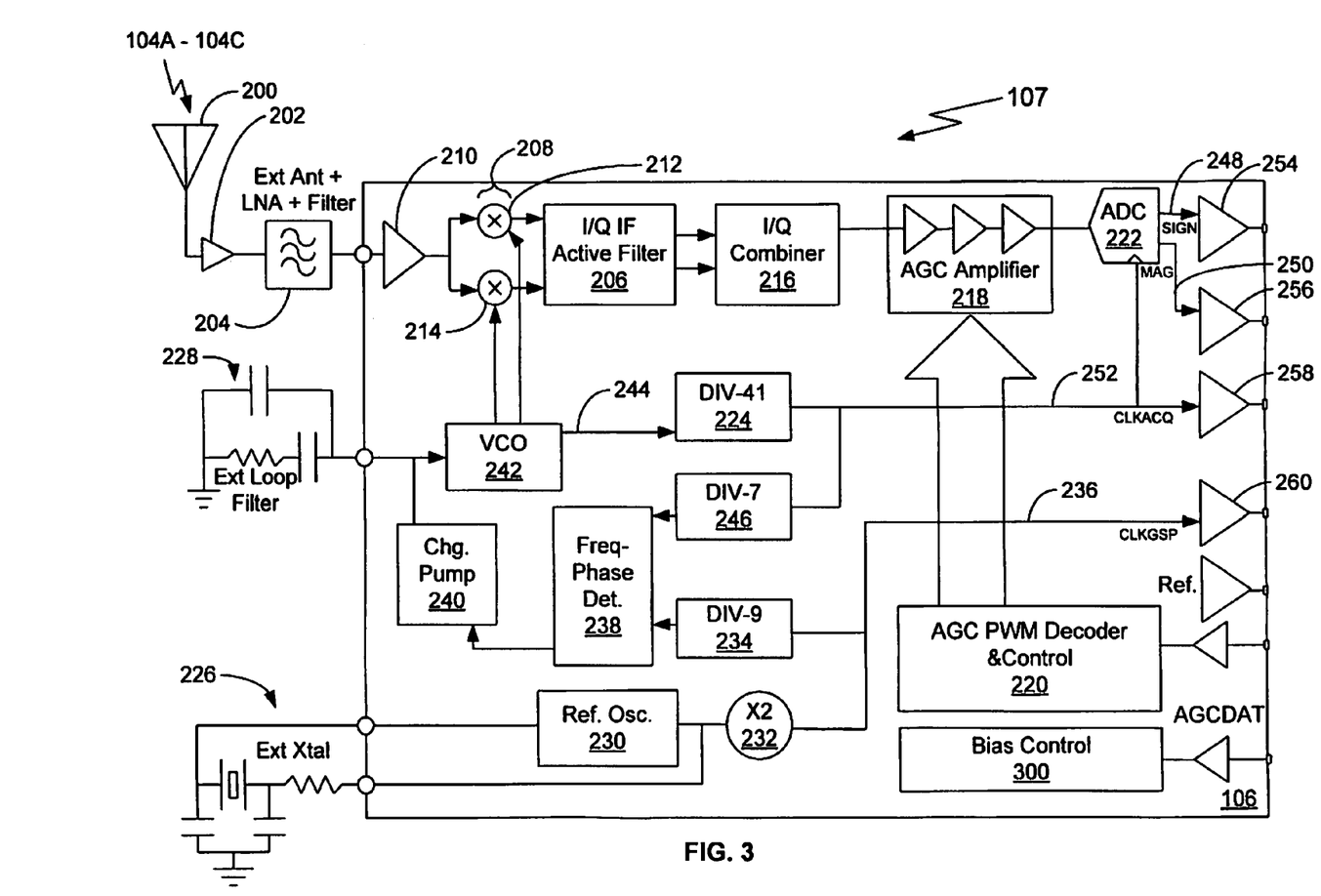
FIG. 3 is a block diagram illustrating an alternative embodiment of the GPS RF front end of the present invention.

FIG. 3 illustrates a second implementation of the invention.

In FIG. 3, bias control 300 is used to power down portions of RFIC 108 depending on which circuits within the RFIC 108 are needed to receive and/or process signals as determined from the digital ASIC 110, or some other portion of receiver 106. For example, since the implementations of RF front end 108 shown in FIGS. 2 and 3 use an IF filter section, which comprises mixer 208, Filter 206, and combiner 216, typically use an IF frequency centered at about 9.5 MHz, such an approach allows some of these sections, namely everything shown in FIG. 3 except the crystal oscillator 230, the X2 frequency doubler 232, and the GPSCLK PECL drivers 260 and reference 262 to the turned off when not needed, e.g., when the GPS signals 104A-104C (FIG. 1) are not being received, but a processing clock is still required for processing the signals on the digital ASIC 110. This approach minimizes the power consumption of the portion of receiver 106 shown in FIG. 3, depending on the state of the RF front end 107.

Interface

Figure 4:
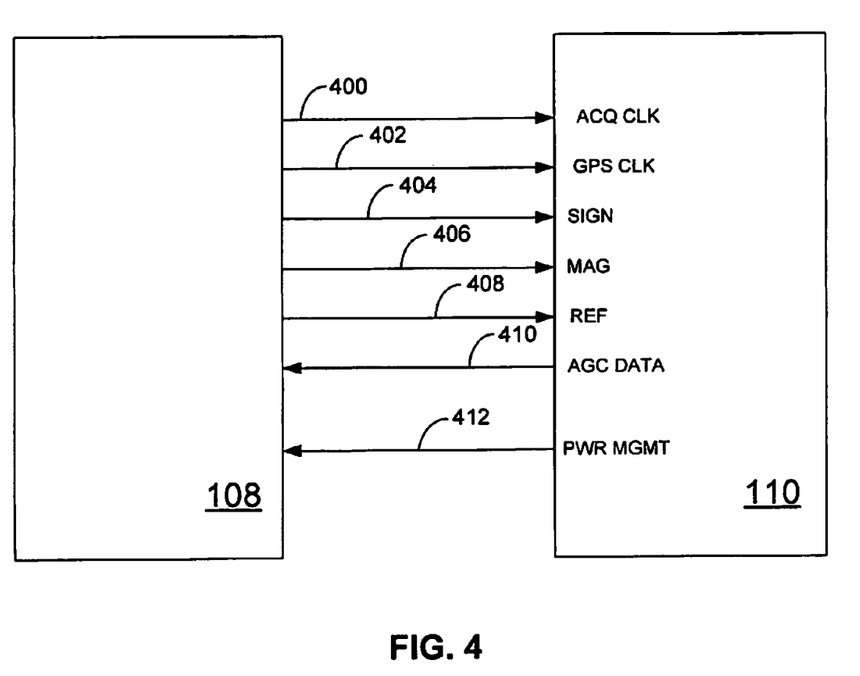
FIG. 4 is an illustration of the interface between the RF front end and the digital processing section of the present invention.

FIG. 4 is an illustration of the interface between the RF front end and the digital processing section of the present invention.

As described herein, the present invention allows for a PECL interface between the RF front end 108 IC and the digital ASIC (processing section) 110 for some signals. Such an interface comprises an acquisition clock (ACQ CLK or CLK ACQ) signal 400, a GPS Clock (GPS CLK or CLK GPS) signal 402, a SIGN signal 404, a MAG signal 406, and a reference (PECL REF or REF) signal 408. The interface also comprises non-PECL signals from the digital ASIC 110 to the RFIC 108, such as an AGC Data (AGC DATA or AGCDAT) signal 410. The interface may also comprise a power management (PWR MGMT) signal 412 that is usually input into the bias control 300. Signal 412 is typically used to turn the RF front end 108 on and off based on the needs of the receiver or system. The power management signal 412 is typically a low bandwidth, low-power signal, such as a CMOS control signal.

The interface of the present invention couples the RF front end 107 to the digital processing section 110, which processes the signals 400-410 and determines a position of the GPS receiver 106. Since the interface uses PECL compatible signals for the clock and data signals there will typically be less interference generated by signals in the interface, than if the interface employed TTL or CMOS compatible signals.

CONCLUSION

Although the description of the present invention herein describes specific embodiments of the present invention, the scope of the present invention includes other embodiments of the present invention not described herein. For example, there are other combinations of a GPS receiver possible given the LNA, mixer, amplifier, VCO, and other functions described in the systems presented in FIGS. 1 and 2 that do not substantially change the systems described above. Those skilled in the art will also realize that minor variations of the reference frequencies and filter bandwidths are within the scope of the present invention. Those skilled in the art will also realize that implementing the RF front end described above in different semiconductor technologies, e.g., different materials such as Gallium Arsenide, bipolar, CMOS, NMOS, PMOS, BiCMOS, or other circuit methodologies, is still within the scope of the present invention.

In summary, the present invention describes an apparatus that functions as the RF portion of a GPS receiver. The RF front end comprises an RFIC that includes a single stage downconverter using dual mixers, an I/Q Intermediate Frequency (IF) active filter, an I/Q Combiner, an Automatic Gain Control (AGC) IF amplifier, an Analog-to-Digital Converter (ADC), and a frequency synthesizer section, wherein the noise bandwidth of the GPS receiver is set by the active filter.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention not be limited by this detailed description, but by the claims appended hereto.

What is claimed is:

1. A Global Positioning System (GPS) receiver, comprising:
   a Radio Frequency (RF) Front End, comprising:
      a single stage downconverter using dual mixers that downconverts a received GPS signal;
      an I/Q Intermediate Frequency (IF) active filter, coupled to the downconverter;
      an Automatic Gain Control (AGC) amplifier, coupled to the downconverter;
      an Analog-to-Digital Converter (ADC) coupled to the AGC amplifier; and
      a frequency synthesizer section including an integrated Voltage Controlled Oscillator and a reference oscillator with a frequency of 24.5535 MHz plus or minus 40 parts per million (ppm), and further comprising:
         a frequency doubler coupled to the reference oscillator;
         a divide-by-9 circuit coupled to the frequency doubler;
         a phase and frequency detector (PFD) coupled to the divide-by-9 circuit;
         a charge pump coupled between the PFD and the VCO;
         the voltage controller oscillator (VCO) that is also coupled to the downconverter;
         a divide-by-41 circuit coupled to the VCO; and
         a divide-by-7 circuit coupled between the divide-by-41 circuit and the PFD to make a phase locked loop; and
   a digital processing section, coupled to the RF Front End, wherein the noise bandwidth of the GPS receiver is set by the IF active filter.

2. The GPS receiver of claim 1 wherein the reference oscillator is adapted for receiving an external reference signal.

3. The GPS receiver of claim 1 further comprising a crystal for providing an external reference signal to the reference oscillator.

4. The GPS receiver of claim 1, wherein output interface signals of the RF Front End are Positive Emitter Collector Logic (PECL) compatible.

5. The GPS receiver of claim 4, wherein the PECL compatible outputs of the RF Front End further include an acquisition clock (ACQCLK) signal generated by the frequency synthesizer section.

6. The GPS receiver of claim 4, wherein the ACQCLK signal has a frequency approximately equal to 37.3333fo, where fo=1.023 MHz.

7. The GPS receiver of claim 6, wherein the PECL compatible outputs further include a GPS clock (GPSCLK) signal output from the frequency synthesizer section.

8. The GPS receiver of claim 7, wherein the GPSCLK signal has a frequency approximately equal to 48fo, where fo=1.023 MHz.

9. The GPS receiver of claim 1, comprising an external antenna assembly coupled to the RF front end.

10. The GPS receiver of claim 9 wherein the external antenna assembly comprises an antenna coupled to a low noise amplifier (LNA), and a radio frequency (RF) bandpass filter coupled to the LNA.

11. The GPS receiver of claim 1 wherein the synthesizer comprises an external loop filter coupled to the VCO.

12. The GPS receiver of claim 1 the RF front end further comprising an I/Q combiner circuit coupled to the IF active filter for combining filtered I-IF and Q-IF outputs received therefrom and outputting a single IF output signal to the AGC amplifier.

* * * * *